United States Patent [19]

Berry

[11] Patent Number: 4,572,765
[45] Date of Patent: Feb. 25, 1986

[54] METHOD OF FABRICATING INTEGRATED CIRCUIT STRUCTURES USING REPLICA PATTERNING

[75] Inventor: Robert L. Berry, San Mateo, Calif.

[73] Assignee: Fairchild Camera & Instrument Corporation, Mountain View, Calif.

[21] Appl. No.: 490,622

[22] Filed: May 2, 1983

[51] Int. Cl.[4] .................... B44C 1/22; C03C 15/00; C03C 25/06

[52] U.S. Cl. .................... 156/643; 29/576 R; 148/187; 156/646; 156/651; 156/653; 156/657; 156/659.1; 357/50

[58] Field of Search ........ 156/643, 646, 647, 650–653, 156/657, 659.1, 661.1, 662; 29/571, 580, 583, 578, 591, 576 R, 576 B; 148/1.5, 187; 430/313, 317, 314; 427/85, 88, 89; 357/47, 49, 50, 65

[56] References Cited

U.S. PATENT DOCUMENTS 3,783,047  1/1974  Paffen et al. .................... 156/648 X
4,387,145  1/1983  Lehrer et al. .................... 156/653 X Primary Examiner—William A. Powell
Attorney, Agent, or Firm—Townsend and Townsend

[57] ABSTRACT

A method of defining narrow regions in an underlying integrated circuit structure includes the steps of depositing a first layer of material 30 having selected etching characteristics on the underlying integrated circuit structure, depositing a second layer of material 32 having etching characteristics different from the first layer 30 on the first layer 30, anisotropically etching the first layer 30 and the second layer 32 from all of the underlying integrated circuit structure 26 except for a desired region having a periphery which includes the narrow region, forming a coating 35 of smoothing material over all of the underlying integrated circuit structure 26 except for the first layer 30, and isotropically etching the first layer 30 to remove it from the surface of the underlying integrated circuit structure 26 to thereby define the narrow region 36. Use of the process to fabricate a compact bipolar transistor structure is also disclosed.

29 Claims, 25 Drawing Figures

METHOD OF FABRICATING INTEGRATED CIRCUIT STRUCTURES USING REPLICA PATTERNING

BACKGROUND OF THE INVENTION

1. Field of the Invention

This invention relates to integrated circuit structures and methods of fabricating them, and to a technique for fabricating integrated circuit structures utilizing replicating coatings and lateral etching techniques to reliably define smaller features in integrated circuit structures than heretofore possible. The invention also relates to integrated circuit structures fabricated utilizing such techniques.

2. Description of the Prior Art

Integrated circuit fabrication technology utilizing lateral etching processes is known. For example, in U.S. Pat. No. 3,940,288, M. Takati et al. teach several techniques for fabricating transistors and associated electrical connections. Some of these techniques utilize lateral etching and double diffusion technology to fabricate transistor structures. M. Paffen et al. in U.S. Pat. No. 3,783,047, teach the fabrication of different integrated circuit structures which may be fabricated utilizing lateral etching techniques.

H. Kamioka et al. in "A New Sub-Micron Emitter Formation with Reduced Base Resistance for Ultra High Speed Devices," presented in December 1974 to the International Electron Devices Meeting, and published at page 279 of the Technical Digest of that meeting teach the fabrication of a compact NPN vertical transistor. The structure shown therein utilizes lateral etching techniques to define the emitter region. W. Hunter in "New Edge-Defined Vertical-Etch Approaches for Sub-micrometer MOSFET Fabrication" presented at the 1980 International Electron Devices Meeting and described beginning on page 764 of the Technical Digest of that meeting teaches the fabrication of regions in MOS devices utilizing lateral etching techniques and conformal coatings.

SUMMARY OF THE INVENTION

This invention provides a process for fabricating integrated circuit structures having very narrow regions on the order of less than one micron. The invention further provides a technique by which smoothing coatings may be utilized to fabricate arbitrarily spaced apart narrow regions in an underlying integrated circuit structure. A smoothing coating is one which tends to fill in depressions in the underlying structure, thus tending to smooth or flatten the surface.

In one embodiment a method of defining narrow regions in an underlying integrated circuit structure comprises: depositing a first layer of material having selected etching characteristics on the underlying integrated circuit structure; depositing a second layer of material having different etching characteristics from the first layer on the first layer; removing the first layer and the second layer from all of the underlying integrated circuit structure except for desired regions, each having a periphery which includes one of the narrow regions to be defined; etching the first layer inward from the periphery of each of the desired regions to the narrow region therein to thereby remove the first layer from the narrow regions over the underlying integrated circuit structure; coating all of the resulting structure with smoothing or self-leveling material; and removing the first layer thereby defining each narrow region in the underlying integrated circuit structure.

In another embodiment of the invention the step of coating is followed by the step of removing all of the smoothing material except where overlaid by the second layer.

BRIEF DESCRIPTION OF THE DRAWINGS

FIGS. 7 and 8 illustrate one process which may be applied to the structure of FIG. 6, with:

FIG. 7 illustrating a subsequent cross-sectional view after selectively and anisotropic etching of the structure shown in FIG. 6, and FIG. 8 illustrating a subsequent cross-sectional view after removal of the laterally etched layer.

DESCRIPTION OF THE PREFERRED EMBODIMENTS

Figure 1:
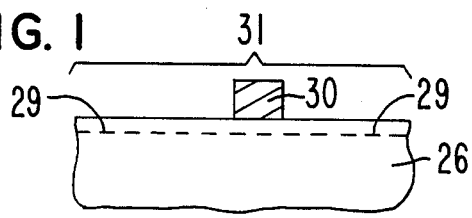
FIGS. 1 and 2 illustrate the general technique of replica patterning.
Figure 2:
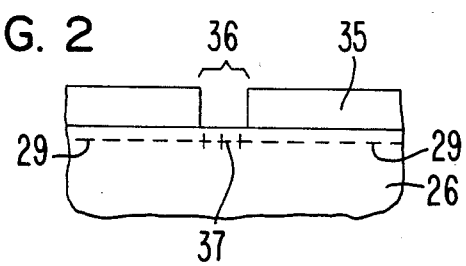

FIGS. 1 and 2 illustrate the generalized technique which I have discovered and term "replica patterning." Generally, replica patterning allows the fabrication of numerous self-aligned regions in a semiconductor structure. The technique of replica patterning is shown in FIGS. 1 and 2, and further embodiments of the technique are shown in the remaining Figures.

As shown in FIG. 1, a semiconductor substrate 26 has formed on its upper surface a region of selected material 30. Substrate 26 may comprise silicon or other semiconductor material, or may be a partially completed semiconductor structure. For example, substrate 26 may comprise a semiconductor structure or an integrated circuit already having numerous regions formed therein.

Region 30 may be any material formed on the upper surface of substrate 26 using any well-known technique. Suitable techniques include known photolithographic processes in widespread use in the integrated circuit fabrication arts, or other known techniques. Of particular advantage is a lateral etching technique described below in conjunction with FIGS. 3 through 5. After formation of region 30, the overall structure shown in FIG. 1 may or may not be processed using other known integrated circuit fabrication processes, depending upon the ultimately desired structure. As an example of such a processing technique, the structure shown in FIG. 1 has been subjected to ion implantation across the entire width 31 of the structure depicted. By choosing suitable well-known ions and implant energies, material 30 will act as a mask for the ion implantation. In this manner, ions 29 will be implanted into substrate 26 everywhere except where substrate 26 is protected by overlying region 30.

As next shown by FIG. 2, a layer of replicating material 35 is deposited across the upper surface of substrate 26. By appropriate selection of materials and application techniques as described below, material 30 will flow and generally smooth itself as depicted. In general, replicating material 35 will be a non-conformal material, that is, a material which is generally self-leveling, and therefore, tends to follow only the larger features in the topography of the integrated circuit structure. Suitable replicating materials include photoresist, or other suitable polymers which are flowable. In one embodiment of the invention material 35 is deposited over and around region 30 in a thicker layer than eventually desired and then etched back to the same or thinner thickness as layer 30.

After formation of replicating layer 35, which will be a material having different physical properties from layer 30, particularly resistance to various chemical etching solutions, reactive ion etching or plasma gases, material 30 may be removed to define an opening 36. For example, in one embodiment of the invention, material 30 comprises silicon dioxide and material 35 comprises photoresist. Thus silicon dioxide 30 may be removed using a solution containing hydrofluoric acid, without materially altering region 35. After removal of material 30, material 35 may be used as a mask for a subsequent process step. In FIG. 2 material 35 has been used as a mask for the subsequent ion implantation of positive ions 37 as shown.

By virtue of replica patterning, the region of positive ions 37 will be self-aligned to the region of negative ions 29, that is, the alignment between the regions of positive and negative ions will not depend upon the alignment tolerances of any apparatus used to control the implantation of the ions, but rather upon the fact that the coating of material 35 extends over all of the surface of substrate 26 except where prevented by region 30.

In another embodiment of my invention the technique described in FIGS. 1 and 2 is reversed. In this embodiment the structure of FIG. 2 is created first, for example, by forming layer 35 across the surface of substrate 26 and then removing it from region 36, using well known techniques. Positive ions may then be introduced, followed by formation of a coating 30 in opening 36. The surrounding material 35 is next removed and negative ions 29 introduced as shown by FIG. 1.

Figure 3:
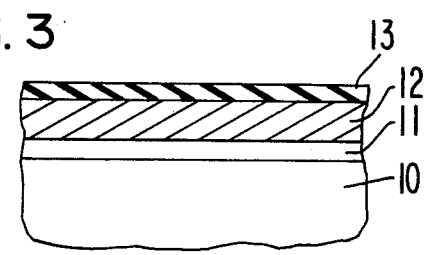
FIG. 3 is a cross-sectional view of an integrated circuit structure including overlying layers of materials having different etching characteristics.

In the fabrication of integrated circuit structures it is desirable to define regions as compactly as possible. This enables the fabrication of larger numbers of active and/or passive electronic components in a given area, and thereby lowers the cost of producing circuits containing these components. The techniques described in conjunction with FIGS. 3 through 9 illustrate several techniques for fabricating regions (such as region 30 depicted in FIGS. 1 and 2) with typically smaller dimensions than may be obtained using photolithographic techniques. FIG. 3 is a cross-sectional view of an integrated circuit structure which includes an underlying substrate 10 having overlying layers 11, 12 and 13. The underlying substrate 10 may include various regions of different conductivity type to thereby form particular active and/or passive electronic components therein. To simplify the drawings these active and/or passive regions are not shown, however, as will be evident the presence or absence of these regions generally does not effect the process of this invention, however, the particular sandwich structure shown may be adapted to different underlying materials. The overlying layers shown in FIG. 3 have the characteristic that the middle layer 12 etches much more rapidly in a selected etching solution than do the top layer 13 or the bottom layer 11. For example, layer 11 may comprise polycrystalline silicon, layer 12 may comprise silicon dioxide ($SiO_2$), and layer 13 may comprise silicon nitride ($Si_3N_4$). Such materials satisfy the criterion that the center layer etch more rapidly than the top and bottom layers, because silicon dioxide etches readily in a solution of ammonium fluoride and hydrofluoric acid while silicon and silicon nitride are essentially unaffected by that solution. Typically layer 11 will be as thick as the total thickness of layers 12 and 13 combined.

Figure 4:
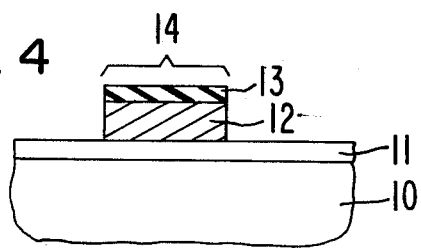
FIG. 4 is a subsequent cross-sectional view after removing part of the top two layers.

The structure shown in FIG. 3 is anisotropically etched to define a region of desired width 14 shown in FIG. 4. This may be achieved, after using known photolithographic techniques to define a mask to protect region 14, by using a plasma reactor and an etch gas comprising carbon tetrafluoride and hydrogen to etch layers 12 and 13. The resulting structure is depicted in FIG. 4.

Figure 5:
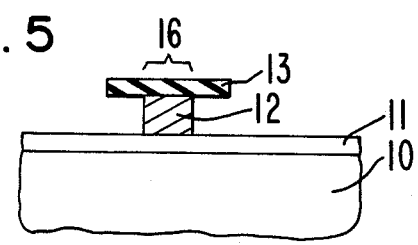
FIG. 5 is a subsequent cross-sectional view after laterally etching one of the layers.

The center layer 12 is then selectively and partially etched in a lateral direction as shown by FIG. 5. This may be achieved by immersing the structure depicted in FIG. 2 in the above buffered etchant. Such a solution will remove layer 12 laterally from each exposed surface at a rate of about 0.1 microns per minute. Accordingly, by careful control of the time during which the structure is etched, region 12 may be laterally etched to create overhangs having widths which may be less than the smallest width 14 definable using photolithographic techniques.

Next, a uniformly thick layer of replicating material 15 is formed across the entire structure shown in FIG. 5. If the material is sufficiently fluid the structure depicted may be created by simply applying the layer of material 15 and then curing or otherwise treating the layer to adhere the coating to the underlying structure.

Figure 6:
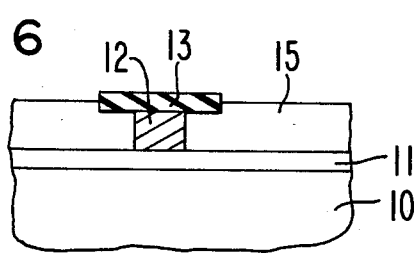
FIG. 6 is a subsequent cross-sectional view after coating the structure with replicating material and etching it back.

The manner in which the replicating material 15 is applied to the surface of the integrated circuit structure will depend upon the particular topography of the integrated circuit structure and the physical properties of material 15. If material 15 is less fluid, then it may be deposited across the surface of an integrated circuit structure having relatively small, widely spaced features, for example as shown in FIGS. 5 and 6. If the features are larger, or more closely arranged, or if the replicating material is relatively viscous, then particular processing may be required to obtain a sufficiently flat upper surface of material 15.

The particular processing utilized to obtain a sufficiently flat upper surface for material 15 will depend upon the material and the structure of the circuit. For example, one such process is to deposit a single relatively thick layer of the material and then etch the material from the highest regions of the integrated circuit using a special mask for that purpose or a mask used to define those higher features. A second layer of replicating material 15 is then deposited and anisotropically etched to create the flat upper surface depicted in FIG. 6. The above technique allows replicating both very coarse and very fine features, and in general it may only be necessary to remove the material above or around the coarser geometries.

After the replicating material 15 is deposited, the structure is planar etched to expose the top layer 13 as shown in FIG. 6. This may be achieved using well-known plasma or reactive ion etching technology and an etchant suitable for removing positive photoresist 15 such as oxygen, or other suitable techniques.

The structure shown in FIG. 6 then may be further processed utilizing either of two techniques. The first technique is described in conjunction with FIGS. 7 and 8, while the second technique is described in conjunction with FIG. 9.

Figure 7:
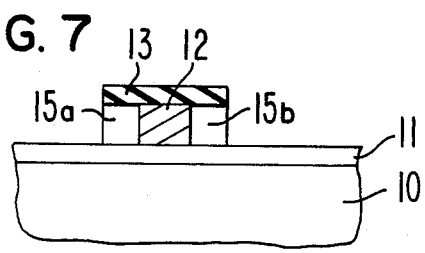
Figure 8:
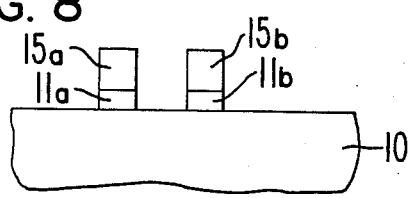

According to the first technique the anisotropic etching process described in conjunction with FIG. 6 is continued until the exposed regions of material 15 are removed from the surface of layer 11 everywhere except beneath the protective layer 13. In this manner the structure shown in FIG. 7 is created. Next, nitride layer 13 is etched anisotropically to remove it except where overlaid by layer 12. The remaining portion of silicon dioxide layer 12 may then be removed using a suitable chemical or plasma etchant, followed by removing the portion of layer 11 thereby exposed. Depending upon the desired structure, the portion of polycrystalline silicon layer 11 between nonconformal regions 15a and 15b may be removed either isotropically or anisotropically. The resulting structure is shown in FIG. 8, and may be used as a mask to implant further impurities into substrate 10, or for other desired uses.

Figure 9:
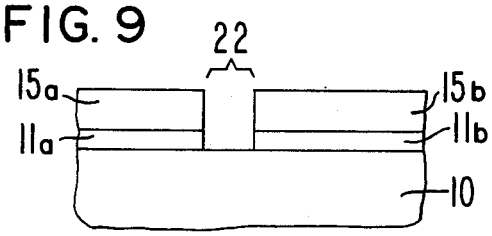
FIG. 9 illustrates another process which may be applied to the structure of FIG. 6 in which the overlying layer and the laterally etched layer are removed.

An alternative process which may be applied to the structure shown in FIG. 6 is depicted in FIG. 9. The structure shown in FIG. 9 may be achieved from that shown in FIG. 6 by removing layer 13, then underlying layer 12, and lastly the thereby exposed portion of layer 11. In this manner a single narrow opening 22 is made to the surface of substrate 10. Opening 22 may be used to define other regions in substrate 10.

The techniques described in conjunction with FIGS. 3 through 9 may also be employed to define a narrow region other than the narrow region directly beneath layer 12 in FIG. 5. The narrow region may also be the region beneath that portion of layer 13 which overhangs layer 12. In this manner using the techniques explained in conjunction with FIGS. 6 through 8 an annular band of masking material comprised of layers 11 and 15 may be defined on the surface of the semiconductor structure.

Alternatively the techniques described in conjunction with FIG. 9 may be used to create a plurality of small openings 22 to the surface of the semiconductor substrate 10. This is achieved by forming a plurality of structures comprising layers 12 and 13 (as depicted in FIG. 5) across the surface of layer 11 in various desired locations.

Figure 10:
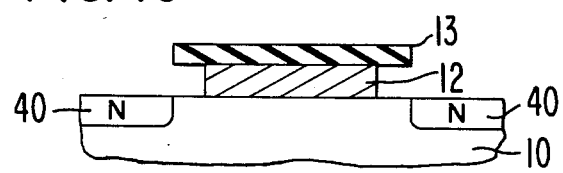
FIG. 10 is a cross-sectional view of a semiconductor structure.
Figure 11:
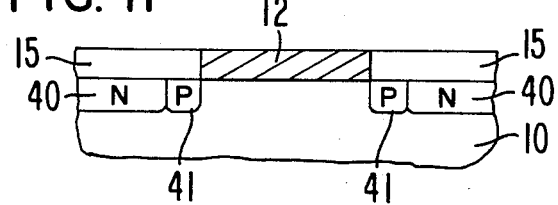
FIG. 11 is a subsequent cross-sectional view after formation of a smoothing coating.
Figure 12:
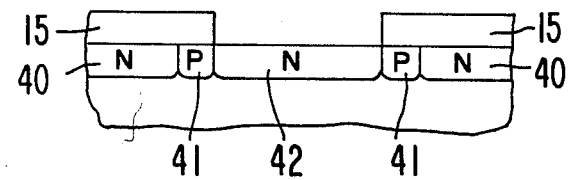
FIG. 12 is a subsequent cross-sectional view after definition of additional regions in the substrate.

Another application of my invention is described in conjunction with FIGS. 10 through 12. As shown in FIG. 10 a pair of layers 12 and 13 are deposited or otherwise formed on a substrate 10 and defined using the same techniques described in conjunction with FIGS. 3 through 5. Using ion implantation, regions 40 of selected conductivity type may be introduced in the surface of substrate 10. In FIG. 10 regions 40 are N conductivity type.

Next, as shown in FIG. 11, layer 13 is removed using known integrated circuit fabrication techniques. P conductivity type impurities 41 are then introduced into the thereby exposed regions of substrate 10. By appropriate selection of impurity concentrations, the P conductivity type regions 41 will not overdope the N conductivity type regions 40. A layer of replicating material 15 is then deposited across the surface of the substrate.

As then shown by FIG. 12, layer 12 is removed and a further N conductivity type region 42 formed. In this manner a lateral NPN transistor is formed, or a pair of lateral transistors having either coupled emitters or collectors, depending upon the connections made to region 42. Of course the conductivity types may be reversed to create a pair of PNP lateral transistors.

Figure 13:
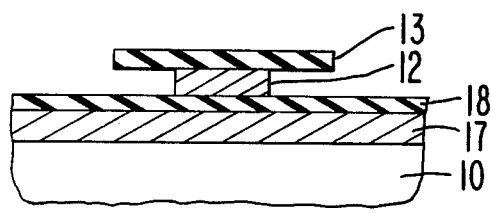
FIG. 13 is a cross-sectional v;iew of a semiconductor structure.
Figure 14:
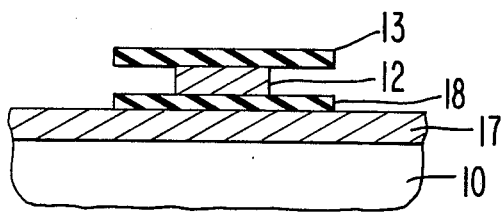
FIG. 14 is a subsequent cross-sectional view after etching of layer 18.
Figure 15:
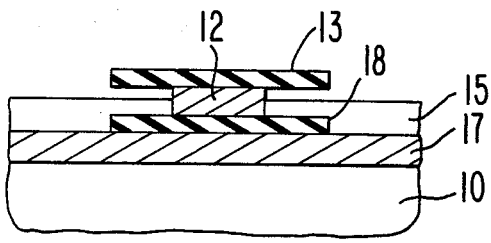
FIG. 15 is a subsequent cross-sectional view after formation of layer 15.
Figure 16:
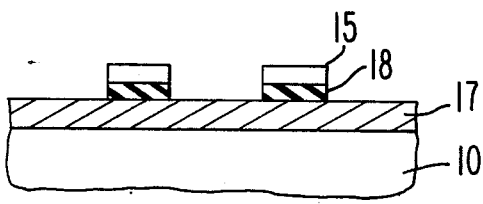
FIG. 16 is a subsequent cross-sectional view after removal of layers 13 and 12, and portions of 15 and 18.

Another embodiment of the invention is described in conjunction with FIGS. 13 through 18. As shown in FIG. 13 using known processing techniques, a semiconductor structure is created which includes a substrate 10, an overlying silicon dioxide layer 17, a layer of silicon nitride 18, a second layer of silicon dioxide 12 and an overlying layer of silicon nitride 13. The upper two layers are defined and laterally etched as previously explained to create the structure depicted. As shown in FIG. 14, layer 13 is used as a mask for anisotropically etching layer 18, which need not be completely removed depending upon the subsequent desired structure. In so doing the thickness of layer 13 will be reduced. If it is desired not to reduce the thickness of layer 13 by this step, then layer 13 may be fabricated from a different material than layer 18, that is, a material which is resistant to the etching process used to define layer 18. A replicating coating 15 is then formed across the upper surface of silicon dioxide 17 to create the structure depicted in FIG. 15. This may be achieved using the processing techniques described above in conjunction with FIG. 6. In some embodiments polycrystalline silicon will be used in place of silicon nitride because of the relative ease of forming thick high quality coatings having predictable etch rates.

Layer 13 is then used as a mask for anisotropically etching layer 15 to remove all portions of layer 15, except that portion disposed beneath the overhanging portion of layer 13. Layer 13 itself is then removed using a suitable chemical or plasma etching process. In a similar manner layer 12 is removed together with the thereby exposed regions of layer 18 to create the structure depicted in FIG. 16.

Figure 17:
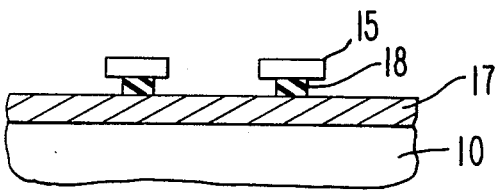
FIG. 17 is a subsequent cross-sectional view after lateral etching of layer 18.
Figure 18:
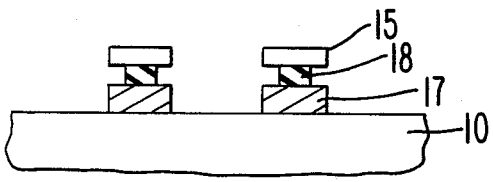
FIG. 18 a subsequent cross-sectional view after anisotropic etching of layer 17.
Figure 19:
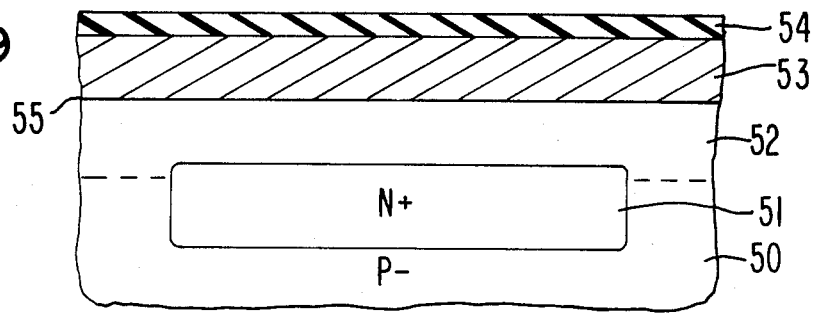
FIG. 19 is a cross-sectional view of a semiconductor structure which may be fabricated utilizing known processes.

The lateral etching process described in conjunction with FIG. 5 is then performed to undercut layer 18 from beneath layer 15 as shown in FIG. 17. Layer 17 may then be patterned using layer 15 as a mask. The structure shown in either FIG. 17 or FIG. 18 may then be processed using the techniques described in conjunction with FIGS. 3-9 to create desired regions in substrate 10. In the manner depicted in FIGS. 13 through 18 the technique of this invention may be repeatedly used to create narrow regions spaced closely together.

Figure 20:
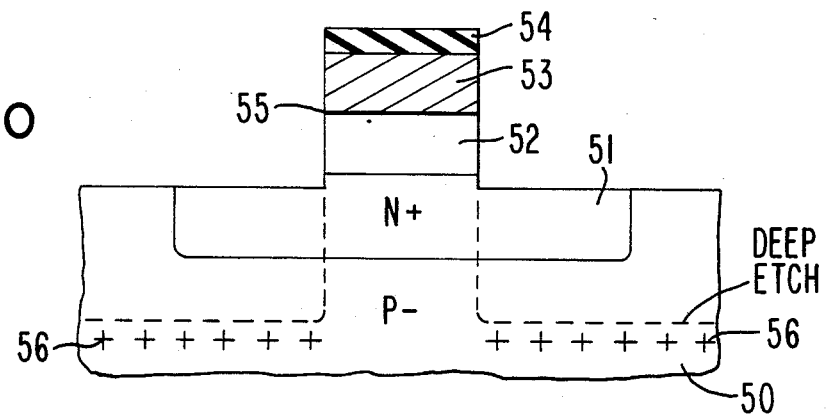
FIG. 20 is a cross-sectional view after etching the field regions.

FIGS. 19 through 25 illustrate how the particular fabrication techniques described above may be utilized to manufacture an extremely compact transistor structure. The structure shown in FIG. 19 may be achieved by using a variety of known processes. The structure includes a P conductivity type substrate 50, an N conductivity type buried layer 51, an instrinsic epitaxial layer 52, an overlying layer 53 of silicon dioxide, and a top layer 54 of silicon nitride. In the preferred embodiment a very thin layer of silicon nitride 55 is formed between the silicon dioxide 53 and layer 52. One technique for achieving the illustrated structure of substrate 50, buried layer 51, and epitaxial layer 52 is disclosed in U.S. Pat. No. 3,648,125 issued to Douglas L. Peltzer and entitled "Method of Fabricating Integrated Circuits with Oxidized Isolation and the Resulting Structure." In the preferred embodiment substrate 50 will be doped to a concentration of $10^{15}$–$10^{17}$ atoms per cubic centimeter of boron, while buried layer 51 will be doped to a concentration of approximately $2 \times 10^{19}$ to $10^{20}$ atoms per centimeter of antimony or arsenic. After deposition of epitaxial layer 52, silicon nitride 55, silicon dioxide 53 and silicon nitride 54 may be deposited. Silicon nitride layer 55 is 50-200 Angstroms thick, and is deposited after hardening the underlying structure by ion implantation or formation of thin polycrystalline silicon. Silicon dioxide layer 53 is approximately 7000 Angstroms thick and may be fabricated by chemical vapor deposition. As shown in FIG. 20, the structure is then etched to remove portions of layers 52, 53 and 54, and portions of buried layer 51 and substrate 50. For other embodiments in which the buried layer 51 is not to interconnect various regions above different parts of layer 51, a deeper etch (to the dashed-line marked deep etch) is performed, or a combination of deep and shallow etch. In the preferred embodiment for a deep etch, plasma containing carbon tetrafluoride and hydrogen is used to etch through silicon nitride 54 and silicon dioxide 53, and a plasma containing chlorine is used to etch through silicon layers 52 and 51 and a portion of substrate 50. The remaining FIGS. 21 through 25 assume that a shallow etch has been performed, however, as will be evident, the process described in conjunction with those Figures will be the same regardless of whether a shallow etch or a deep etch was performed.

The field regions of the integrated circuit structure are then ion implanted to create a P conductivity type region 56 which will be formed at the lower surface of the field isolation regions. These P type regions 56 will prevent field inversion and function as channel stops. The unetched portions of nitride 54 and underlying layers prevent implantation of the P conductivity type impurity into the central portion of substrate 50. The P type impurity concentration is not sufficient to reverse the conductivity of region 51. The appearance of the structure after implanting the field 56 is shown in FIG. 20.

Figure 21:
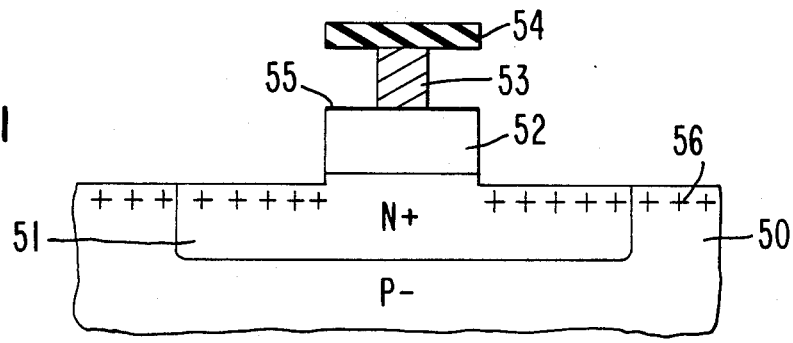
FIG. 21 is a subsequent cross-sectional view after laterally etching a layer near the top of the structure.

Using any desired isotropic process, silicon dioxide layer 53 is next laterally etched as shown in FIG. 21. In the preferred embodiment this is achieved using buffered hydrofluoric acid. Any photoresist overlying nitride 54 is then chemically removed together with the remaining portion of silicon nitride layer 54.

Figure 22:
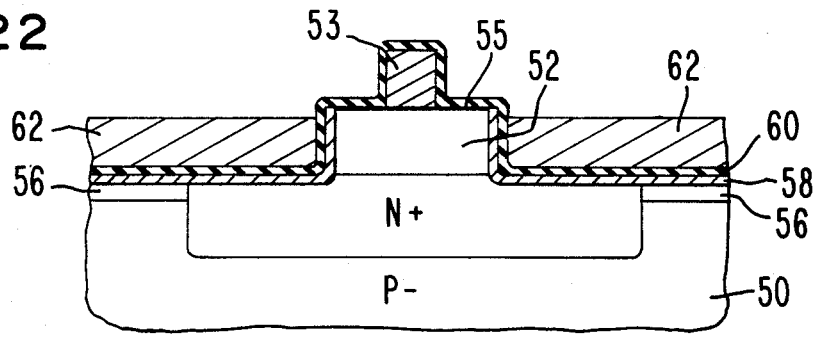
FIG. 22 is a subsequent cross-sectional view after formation of a thin layer of silicon dioxide, a layer of silicon nitride, and formation of the field oxide regions.

Next, a thin layer, on the order of 500 Angstroms thick, of silicon dioxide 58 is formed across the surface of the exposed portion of substrate 50, and silicon layers 51 and 52. Layer 58 is shown in FIG. 22. This thermal process will also have the effect of diffusing the ions 56 used to prevent channel inversion, thereby creating a uniformly doped region 56 between substrate 50 and overlying silicon dioxide 58. A layer of silicon nitride 60 is then formed across the upper surface of silicon dioxide layers 53 and 58 and on thin nitride layer 55. In the preferred embodiment this is achieved by a chemical vapor deposition process and results in a silicon nitride layer approximately 700 Angstroms thick.

After formation of silicon nitride 60, a relatively thick layer of replicating material 62 is deposited across the structure. In the preferred embodiment layer 62 comprises spin-on glass, which is then densified at 900° C. Typically a much thicker layer than ultimately desired is deposited and then etched back to create the structure shown.

Figure 23:
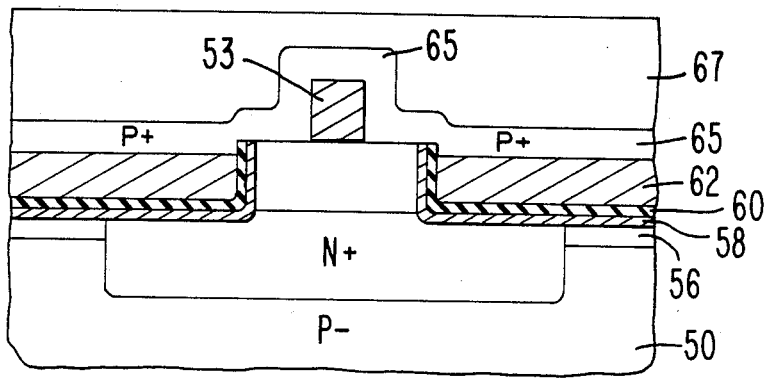
FIG. 23 is a subsequent cross-sectional view of the structure shown in FIG. 22 after deposition of a layer of polycrystalline silicon and an overlying layer of smoothing material.
Figure 24:
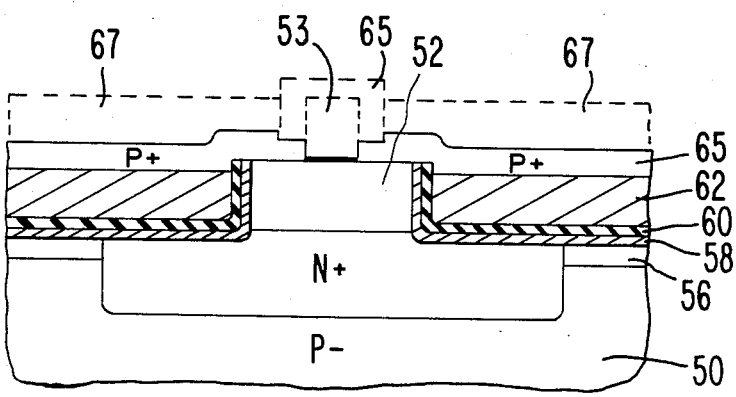
FIG. 24 is a subsequent cross-sectional after removal of a portion of the polycrystalline silicon and the nonconformal material.

The nitride layers 60 and 55 are next removed from the upper surface of layer 52, except where thin nitride 55 is protected by region 53. This may be achieved using an anisotropic etching process, for example, reactive ion etching using $SF_6$. Next, using chemical vapor deposition, a layer of polycrystalline silicon 65 is deposited across the upper surface of the structure as shown in FIG. 23. Because polycrystalline silicon is a conformal material, a substantially uniformly thick layer across the underlying structure will result. The polycrystalline silicon 65 will be doped with a suitable P conductivity type impurity, for example, boron, to make layer 65 electrically conductive. This doping operation may be performed as a subsequent step after chemical vapor deposition of undoped polycrystalline silicon, or polycrystalline silicon 65 may be deposited already doped. In the preferred embodiment polycrystalline silicon layer 65 is 3000 Angstroms thick and is doped to an impurity concentration of approximately $10^{20}$ atoms per cubic centimeter with boron.

Across the upper surface of polycrystalline silicon 65 a relatively thick layer of replicating material 67 is formed. In the preferred embodiment material 67 will comprise densified spin on glass. Material 67 is then etched back to expose the upper portion of polycrystalline silicon 65. The resulting surface of material 67 is shown by the dashed lines in FIG. 24. Next, using an anisotropic etch, the thereby exposed region of polycrystalline silicon 65 shown in dashed lines in FIG. 24 and surrounding material 67 are etched below the rounded shoulder of the silicon as shown by line 1 in FIG. 23. Then silicon 65 is selectively etched to a point approximately flush with the upper surface of the polycrystalline silicon 65 elsewhere on layer 52. The remaining regions of smoothing material 67 and silicon dioxide 53 are then removed using any suitable process, for example, dipping in buffered hydrofluoric acid. After removal of the upper portions of silicon nitride 60, P conductivity type impurities are implanted into epitaxial layer 52 to create what will function as the transistor's active base region. In the preferred embodiment an impurity concentration of approximately $10^{13}$ atoms per square centimeter of boron is used. The appearance of the structure after removal of silicon dioxide 53 and implanting of the base is shown by the solid lines in FIG. 24.

A relatively thin layer of silicon dioxide 70 is next formed across the upper surface of polycrystalline silicon 65. In the preferred embodiment silicon dioxide layer 70 is 2000 Angstroms thick and is formed by heating the underlying structure to a temperature of 800° C. in steam. This relatively thin layer of silicon dioxide 70 functions to electrically isolate underlying polycrystalline silicon 65 from layers of materials deposited on top of oxide 70. Thin nitride 55 is then removed.

Figure 25:
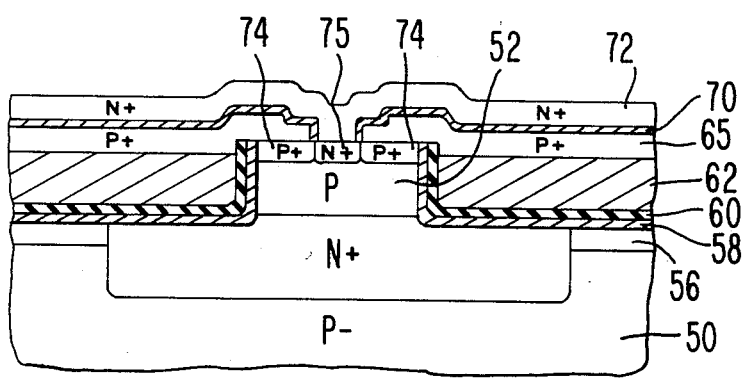
FIG. 25 illustrates the completed transistor structure.

As shown in FIG. 25, another layer of polycrystalline silicon 72 is then deposited across the surface of silicon dioxide 70 and epitaxial layer 52. Layer 72 may be deposited as undoped polycrystalline silicon and then doped with N conductivity type impurities, or may be deposited and doped simultaneously. In the preferred embodiment layer 72 is 2000 Angstroms thick and is doped to a concentration of about $10^{21}$ atoms per cubic centimeter of phosphorous.

After formation of layer 72, the entire structure is heated to a temperature of 900° C. for 30 minutes. During this process P and N conductivity type impurities present in layers 65 and 70 will diffuse out of those layers to form base contacts 74 and emitter 75.

Although several embodiments of the processes of this invention and structure which may be fabricated utilizing those processes have been described, these embodiments are intended to be illustrative of the invention rather than limiting it. The full spirit and scope of the invention may be ascertained from the appended claims.

I claim:

1. A method of defining narrow regions in an underlying semiconductor structure comprising:
   depositing a first layer of material having selected etching characteristics on the underlying semiconductor structure;
   depositing a second layer of material having different etching characteristics from the first layer on the first layer;
   removing the first layer and second layer from all of the underlying semiconductor structure except for desired regions eaching having a periphery which includes a narrow region;
   etching the first layer inward only from the periphery to the narrow region to thereby remove all of the first layer except for the narrow region;
   coating all of the underlying semiconductor structure except where overlaid by the first layer with a non-conformal material;
   removing all of the non-conformal material except where overlaid by the second layer; and
   removing the first layer to thereby define the narrow region in the underlying semiconductor structure.

2. A method as in claim 1 wherein the step of removing the first layer is preceded by a step of removing the second layer.

3. A method as in claim 2 wherein the underlying semiconductor structure comprises silicon, the first layer comprises silicon dioxide, and the second layer comprises silicon nitride.

4. A method as in claim 1 wherein the step of removing the first layer and the second layer comprises anisotropically etching the first layer and the second layer.

5. A method as in claim 4 wherein the step of etching the first layer inward comprises isotropically etching the first layer.

6. A method as in claim 5 wherein the step of removing the first layer comprises isotropically etching the first layer.

7. A method of fabricating a substantially planar layer of material overlying a semiconductor structure having a non-planar surface comprising;
   depositing a first layer of non-conformal material across the integrated circuit structure;
   removing portions of the first layer wherever the first layer traverses an region of the semiconductor structure which is nonplanar to thereby create a smoother surface than in the original integrated circuit structure; and
   depositing a second layer of non-conformal material across the upper surface of the first layer.

8. A method as in claim 7 wherein the step of removing is accomplished by etching.

9. A method as in claim 8 wherein the non-conformal material comprises photoresist.

10. A method of fabricating a transistor structure in a semiconductor substrate including a buried layer of first conductivity type overlaid by epitaxial semiconductor material comprising:
    depositing a region of first material having a periphery, and having selected etching characteristics, on the epitaxial material;
    depositing an overlying layer of second material having etching characteristics different from those of the first material on the first region;
    etching the first material inward only from its periphery to thereby define a narrow region;
    forming a layer of third material containing an opposite conductivity type impurity over all of the epitaxial material except the narrow region overlayed by the first material;
    removing the first material from the narrow region;
    forming insulating material over all of the third material;
    depositing fourth material containing first conductivity type impurities over at least the narrow region; and
    treating the third and fourth materials to cause some of the first and opposite conductivity type impurity therein to move into the epitaxial semiconductor material.

11. A method as in claim 10 wherein first material comprises silicon dioxide.

12. A method as in claim 11 wherein the step of etching comprises etching isotropically.

13. A method as in claim 10 wherein the third material comprises polycrystalline silicon.

14. A method as in claim 13 wherein the fourth material comprises polycrystalline silicon.

15. A method as in claim 14 wherein the insulating material comprises silicon dioxide.

16. A method as in claim 14 wherein the step of treating comprises heating the third and fourth materials.

17. A method of replicating a pattern in an underlying semiconductor structure having a surface comprising:

first defining a pattern of first material on the surface of the semiconductor structure, the first material extending above the surface a first greater thickness;

then depositing a non-conformal coating on the surface of the semiconductor substrate and not on the first material, the non-conformal coating extending above the surface a second lesser thickness;

then removing the pattern; and then introducing selected impurities into the surface of the semiconductor substrate except where overlaid by the coating.

18. A method as in claim 17 wherein following the step of defining a pattern a step of introducing other impurities into the substrate except where overlaid by the pattern is performed.

19. A method as in claim 18 wherein the both the selected and the other impurities are introduced by ion implantation.

20. A method as in claim 19 wherein the pattern is defined photolithographically.

21. A method as in claim 20 wherein the coating comprises photoresist.

22. A method of defining narrow regions and underlying semiconductor structure comprising:

depositing a first layer of material having selected etching characteristics on the underlying semiconductor structure;

depositing a second layer of material having different etching characteristics from the first layer on the first layer;

removing the first layer and the second layer from all of the underlying semiconductor structure except for desired regions, each having a periphery which includes a narrow region, the narrow region not overlaid by the first layer but only by the second layer;

introducing first conductivity type impurity into all of the semiconductor structure except where overlaid by the second layer;

removing the second layer;

introducing opposite conductivity type impurity into all of the semiconductor structure including the narrow region; and coating all of the underlying semiconductor structure except where overlaid by the first layer with a non-conformal material.

23. A method as in claim 22 followed by the step of removing all of the non-conformal material except from beneath the second layer.

24. A method as in claim 22 followed by the step of removing the first layer to expose the semiconductor substrate.

25. A method as in claim 22 followed by the step of removing the second layer.

26. A method as in claim 25 followed by the step of anisotropically etching the non-conformal material to expose a narrow region of the semiconductor substrate.

27. A method as in claim 26 followed by the step of introducing impurities into the narrow region.

28. A method of defining narrow regions in an underlying semiconductor structure comprising:

depositing first, second, third, and fourth layers of material in that order, each having selected etching characteristics, on the underlying semiconductor structure;

removing the second, third and fourth layers from all of the underlying semiconductor structure except for desired regions, each having a periphery which includes a narrow region;

etching the third layer inward only from its periphery to the narrow region to thereby remove all of the third layer except for a portion overlying the narrow region;

coating all of the first and second layers with a non-conformal material except where the second layer is overlayed by the third layer;

anisotropically removing the non-conformal material except where overlaid by the first layer;

removing all remaining portions of the first and second layers, and all of the third layer except where overlaid by the non-conformal material;

laterally etching the second layer inward from all portions of the second layer not coated with non-conformal material.

29. A method as in claim 28 followed by the step of anisotropically removing the first layer except where overlaid by the non-conformal material.

* * * * *